United States Patent [19]

Celler

[11] Patent Number: 4,676,841
[45] Date of Patent: Jun. 30, 1987

[54] FABRICATION OF DIELECTRICALLY ISOLATED DEVICES UTILIZING BURIED OXYGEN IMPLANT AND SUBSEQUENT HEAT TREATMENT AT TEMPERATURES ABOVE 1300° C.

[75] Inventor: George K. Celler, New Providence, N.J.

[73] Assignee: American Telephone and Telegraph Company, AT&T Bell Laboratories, Murray Hill, N.J.

[21] Appl. No.: 781,407

[22] Filed: Sep. 27, 1985

[51] Int. Cl.⁴ .................... H01L 21/265; H01L 21/20
[52] U.S. Cl. ........................................ 148/1.5; 29/571; 29/576 B; 148/175; 148/187; 148/DIG. 82; 148/DIG. 83
[58] Field of Search .................... 148/1.5, 175, 187; 29/571, 576 B; 357/91

[56] References Cited

U.S. PATENT DOCUMENTS

| 4,317,686 | 3/1982 | Anand et al. | 148/1.5 |
| 4,412,868 | 11/1983 | Brown et al. | 148/1.5 |
| 4,461,670 | 7/1984 | Celler et al. | 156/603 |
| 4,490,182 | 12/1984 | Scovell | 148/1.5 |

OTHER PUBLICATIONS

Hemment et al., Vacuum, vol. 34 (Jan. 1984) 203.
Maeyama et al., Jap. Jour. Appl. Physics, 21 (1982) 744.
Jäger et al., Thin Solid Films, 123 (1985) 159.
Hemment et al., Thin Solid Films, 128 (Jun. 1985) 125.
Hemment et al., in Ion Implantation & Ion Beam Processing of Materials, ed. Hubler et al., 1983, North-Holland, N.Y. p. 281.
Lam in Energy Beam—Thermal Processing, ed. Fan et al., North-Holland, 1983, N.Y., p. 579.
Pinizzotto in Ion Impl . . . -of Materials, ed. Hubler et al., North-Holland, N.Y. 1983, p. 265.
Gill et al., Ibid, 1983, p. 275.
Feldman et al., Phys. Rev. Letts. 41, 1978, 1396.

Primary Examiner—Upendra Roy
Attorney, Agent, or Firm—Bruce S. Schneider

[57] ABSTRACT

Dielectrically isolated devices are produced by a series of steps including the implantation of a silicon substrate to produce a precursor to the silicon oxide region and subsequently heat treating this region. In contrast to previous techniques, the extent of such heating is substantially increased to remove a non-oxidic intermediary region typically remaining.

5 Claims, 5 Drawing Figures

FABRICATION OF DIELECTRICALLY ISOLATED DEVICES UTILIZING BURIED OXYGEN IMPLANT AND SUBSEQUENT HEAT TREATMENT AT TEMPERATURES ABOVE 1300° C.

BACKGROUND OF THE INVENTION

1. Field of the Invention

This invention relates to electronic device fabrication and, more particularly, device fabrication involving silicon.

2. Art Background

In most electronic components, such as integrated circuits, lateral separation is produced between regions of essentially single crystal silicon, i.e., silicon having less than a total of $10^{10}$ cm$^{-2}$ defects, e.g., linear and planar defects such as dislocations or stacking faults, respectively. This separation is accomplished by interposing between the single crystal silicon regions a region of electrically insulating material having a thickness approximately equal to the depth of the active regions of the single crystal materials being separated. (The active region is that portion of the single crystal silicon which is modified to contain electronic device structures. The active region is typically 1 $\mu$m thick for nominal voltage devices.) Alternatively, a p-n barrier separates the device regions. In this manner, transistors or other devices formed in one single crystal region, i.e., one active region, are electrically isolated and are prevented from interacting with devices in a second active region.

Vertical isolation, in addition to lateral isolation, is advantageously employed in devices operating at nominal voltages where enhanced reliability is desired. This vertical isolation is provided by underlying some, or most commonly all, of the single crystal silicon regions with a region of electrically insulating material. The additional insulating material providing vertical isolation prevents election hole pairs formed in the underlying substrate by thermal processes or by ionizing radiation from migrating to an active region. Thus, errors in the processing of information by this migration are avoided. Additionally, the vertical isolation reduces capacitance and thus allows faster device operation.

Various processes have been employed to produce a componet having both lateral and vertical isolation. In one process, described by P. L. F. Hemment, *Materials Research Society Symposium Proceedings*, Vol. 33, pages 41-51 (1984), a single crystal silicon substrate is implanted with oxygen. The implantation energy utilized is adjusted so that the implanted oxygen is typically buried a distance in the range 500 to 5000 Angstroms below the substrate surface. After implantation, the substrate is heat treated at temperatures in the range 1000 to 1200 degrees C. to induce formation of silicon oxide in the regions where the implanted oxygen is present. Since the implanted oxygen was buried in the substrate, so is the resulting silicon oxide containing region. Devices formed in the silicon overlying this buried oxide containing region are thus provided with vertical isolation.

Although this procedure has produced vertically dielectrically isolated devices, the results have not been totally satisfactory. In particular, even though silicon oxide is formed, intermediary regions of oxygen-rich, highly defective silicon remain between the silicon oxide containing region and the adjacent single crystalline silicon regions. The presence of these intermediary regions degrades device performance, e.g., increases current leakage at these interfaces. Extensive investigation has been expended in an attempt to eliminate the intermediary region. For example, the heat treatment time has been substantially extended, e.g., to 6 hours and longer. Additionally, very high temperatures induced by laser radiation have also been used in an attempt to enhance the dfficiency of the heat treatment. (See P. L. F. Hemment, *Nuclear Instruments and Methods in Physics Reserch*, Vol. 209/210, page 157 (1983).) However, in neither case is significant improvewment achieved. Indeed, for laser treatment, the silicon quality is degraded.

SUMMARY OF THE INVENTION

The intermediary region present in fabrication procedures involving oxygen implantation followed by heat treatment is eliminated by utilizing a substantially higher temperatre than previously employed. Temperatures in excess of approximately 1300 degrees C. are required to eliminate the intermediary region. Thus, even for unreasonable long treatment times, temperatures are required that substantially exceed those previously employed. For nominal treatment time periods, e.g., 10 to 30 minutes, temperatures in excess of 1200 degrees C. are required to eliminate the intermediary region.

DETAILED DESCRIPTION

Figure 1:
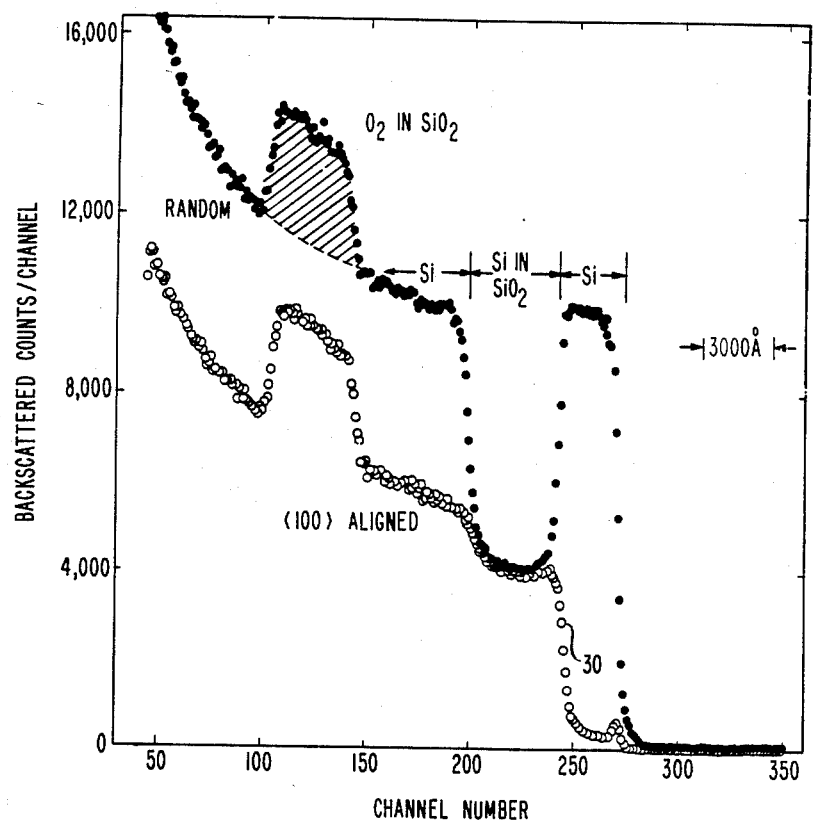
FIGS. 1-4 are illustrative of results achieved with the inventive process.

As discussed, a silicon substrate at an elevated temperature is implanted with oxygen. The resulting structure is heat treated and then devices are completed in the resulting vertically isolated single crystal silicon region. It is desirable to implant a substrate which has mechanical damage on the surface furthest removed from the ultimate implantation region. This roughened surface is advantageously placed face up on the sample holder during the heat treatment procedure. Since the surface is roughened, superheating is prevented and, in turn, melting of the opposite face in proximity to the implanted region is avoided.

The ion implantation process has been extensively described in publications such as Hemment supra Vol. 33 and H. W. Lam and R. F. Pinizzotto, *Journal of Crystal Growth*, Vol. 63, pages 554-558 (1983). Briefly, in one embodiment, oxygen is accelerated through a potential in the range 100 to 400 keV and is impacted on the silicon substrate surface above the region in which implantation is desired. Acceleration potentials in this range typically produce a layer buried under 500 to 5000 Angstroms of silicon. (The boundary of the buried layer containing implanted oxygen is considered delimited by the region where the oxygen concentration is reduced to 10 atomic percent.) The thickness of this region depends on implantation dose and is generally 1000 to 10,000 Angstroms for doses in the range $5 \times 10^{17}$ to $5 \times 10^{18}$ oxygen atoms/cm$^2$. Typically, for devices useful in high-speed circuitry, the upper boundary of the buried oxygen containing region should be at least 2000 Angstroms from the upper surface of the substrate if no subsequent epitaxial silicon deposition is performed. If epitaxial deposition is to be employed to subsequently increase the overlying silicon region thickness, the depth of buried oxygen is not significant provided the surface silicon is sufficiently defect-free to allow growth of single crystal silicon.

The concentration of the implanted oxygen also affects the electrical properties of the device ultimately formed. Generally, it is desired to utilize implanted oxygen atom densities in the range $5 \times 10^{17}$ to $5 \times 10^{18}$ cm$^{-2}$. (Implantation of molecular oxygen is considered equivalent to implantation of two oxygen atoms.) Oxygen atom densities below $5 \times 10^{17}$ cm$^{-2}$ are undesirable because the oxide layer is too thin or ultimately too non-stoichiometric to provide desirable isolation. (Non-stoichiometric silicon dioxide is present if, after heat treatment, less than 90 mole percent of the oxygen is bound to a silicon atom which has another bound oxygen atom.) Oxygen densities above $5 \times 10^{18}$ cm$^{-2}$ are also not advantageous, although not precluded, because they require excessive implantation times. The oxygen implantation is advantageously performed before any device fabrication is undertaken in the active region. However, implantation before certain device fabrication steps such as large area doping or epitaxial silicon growth, which are not substantially degraded by the oxygen impact and/or the subsequent heat treatment, is not precluded.

After oxygen implantation, the substrate is heat treated to produce a silicon oxide region that has relatively sharp boundaries. Sharp boundaries, in the context of the silicon oxide region produced after heat treatment, occur when there is less than 200 Angstroms between single phase, single crystalline silicon and single phase, non-single crystalline stoichiometric silicon dioxide. (A single phase region in the context of this invention is a volume that is at least 95 percent homogeneous.) The adequacy of the heat treatment depends on the temperature utilized and the time of utilization. Surprisingly, through use of a substantially higher temperature, not only is the intermediary layer eliminated, but the silicon dioxide layer thickness is significantly increased for a given oxygen implantation dose. Temperatures below 1300 degrees C. are inadequate to produce a single phase region with sharp boundaries. As the treatment temperature approaches 1300 degrees C., time periods on the order of 6 hours produce a desirable result. However, for many commercial applications, treatment times of this magnitude are not entirely desirable. Therefore, in a preferred embodiment, temperatures in the implanted region in the range 1350 to 1410 degrees C. are utilized for time periods in the range 10 minutes to 2 hours. Typically, the upper end of the time period is utilized for the lower end of the treatment temperature range. The precise temperature and time period required to produce the desired results are determined by utilizing a controlled sample and observing the resulting silicon and silicon oxide region compositions and structures utilizing Rutherford backscattering, channeling, transmission electron microscopy, and/or secondary ion mass spectroscopy.

It has been found that the heat treatment procedure is particularly efficacious when radiant energy is supplied. For example, the lamp furnace described in U.S. Pat. No. 4,461,670, issued July 24, 1984, which is hereby incorporated by reference, is advantageously utilized. This apparatus includes high intensity lamps, e.g., tungsten halogen lamps, to provide the necessary heat. In one embodiment, the substrate is heated in the lamp furnace so that the oxygen-containing region reaches a temperature of approximately 1405 degrees C. Such temperatures are achieved by gradually increasing the temperature provided by the electromagnetic radiation until surface melting is initiated, i.e., surface melting to a depth of a few micrometers is locally obtained. As reported by G. K. Celler et al, in *Applied Physics Letters,* Vol. 43, page 868 (1983), and is discussed in U.S. patent application Ser. No. 681,270, filed Dec. 13, 1984 (which is hereby incorporated by reference), temperatures equivalent to the melting temperature of silicon are achievable without producing a substantial molten zone.

After the appropriate heat treatment, the device structures in the active regions above the silicon oxide regions are produced by conventional techniques such as those described in *VLSI Technology,* L. C. Parrillo, edited by S. Sze, Chapter 11, pages 445–505 (1983). The entire device is then completed by conventional techniques such as those described in Sze supra.

The following examples are illustrative of the invention.

EXAMPLE 1

Silicon substrate having their major surface in the {100} plane and having a diameter of 3 inches were implanted with oxygen. This implantation was accomplished utilizing a heavy ion accelerator. (See J. E. Mynard et al, *Nuclear Instruments and Methods in Physics Research,* Vol. B6, page 100 (1985I), for a description of a suitable implantation apparatus.) A square region of the substrate, 2.5 cm on a side, was implanted. During implantation, the substrates were inclined with a tilt and azimuthal angle of, respectively, 10 degrees and 25 degrees between the ion beam and a normal to the substrate surface. The substrates were maintained during the implantation process at a temperature of approximately 500 degrees C. Molecular oxygen was accelerated through a potential of 400 keV at a current of approximately 50 microamps. The implantation was continued until a dose of $1.8 \times 10^{18}$ oxygen atoms per cm$^2$ was achieved.

The surface was degreased and coated with approximately 0.5 $\mu$m of silicon dioxide deposited through the CVD decomposition of tetraethylorthosilicate with a substrate temperature of approximately 725 degres C. (The silicon dioxide cap thus formed inhibits pitting and/or oxidation of the substrate surface during the heat treatment procedure.)

Figure 3:
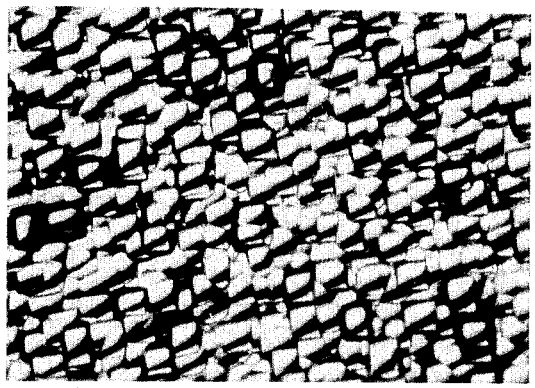
Figure 4:
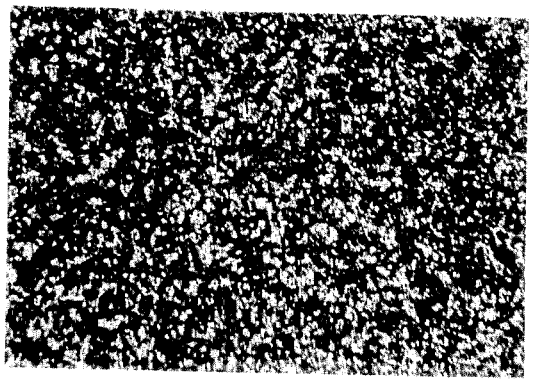

The surface of the substrate furthest removed from the implanted region was inspected under an optical microscope at 200x magnifiction. If irregular surface roughness, as shown in FIG. 4, was observed (as contrasted with etch pits as shown in FIG. 3), no further step before heat treatment was performed. However, if irregular surface roughness was not present, this backside was sand-blasted to produce the desired texture. The defects resulting from this roughness ensured that the rough surface, when treated in the lamp furnace, melted at the silicon melting temperature (rather than superheating) and thus prevented melting of the surface closest to the implanted region.

The substrate was then transferred to the sample holder of a radiant heat furnace. This furnace consisted of two chambers separated from each other and sealed by quartz plates. The substrate was positioned on three quartz pins in the lower chamber, about 0.5 inches above a water-cooled blackened aluminum oven floor. The upper chamber contained a bank of tungsten-halogen lamps suspended below a gold-plated reflector. Both chambers had lateral dimension of 10×12.5 inches. To avoid lamp overheating and early failure, air was forced through the fully enclosed upper chamber, which is essentially a wind tunnel with a quartz lower wall. Three phase-angle fired power supplies controlled by a microprocessor provided power to the lamps. After the substrate was inserted with the surface closest to the implanted region facing away from the lamps, the furnace was closed, the air cooling of the lamps begun, and the water cooling of the oven floor initiated. The sample chamber was flushed with a steady flow of approximately 0.5 liters of nitrogen per minute.

Figure 5:
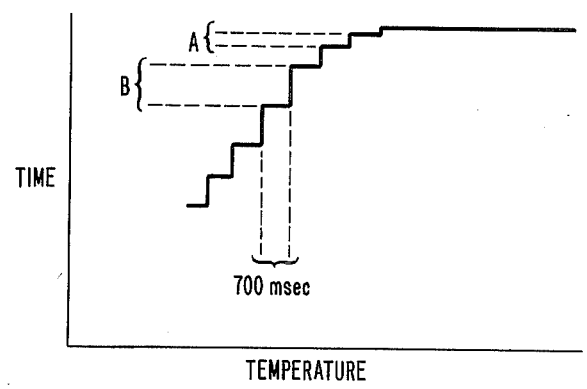
FIG. 5 is illustrative of heat treatment processing parameters.

The temperature was increased by steps. Heating of 0.5 percent of the full radiant power of the oven, i.e., 0.5 percent of approximately 150 kW, was initially employed, and each step was produced by adding another 0.5 percent of full power to the level of radiant heating of the last step. After each step, the temperature was detected utilizing an optical pyrometer. The temperature increment, as measured by the pyrometer between two chronologically adjacent steps, was compared to the temperature increment of the two chronological previous steps. Thus, the increment shown by A in FIG. 5 is compared to the increment shown by B. When A is less than or equal to one-fifth B, melting is initiated and the power is no longer increased but maintained at the level of the final step.

Figure 2:

After 30 minutes of treatment, the lamps were extinguished. The silicon dioxide capping layer was removed by immersing the sample in a buffered oxide etchant that consisted of 7 parts of 40 percent solution of ammonium fluoride in water to 1 part of 49 percent solution of hydrofluoric acid in water until the surface became hydrophobic. The interface between the silicon dioxide region and the silicon region was probed utilizing Rutherford backscattering and transmission electron microscopy. The results of these probes are shown, respectively, in FIGS. 1 and 2. As can be seen within the resolution of the transmission electron microscope, no intermediary region was present. (In FIG. 2, region 23 is silicon, region 22 is silicon dioxide, and region 21 is the substrate.) In FIG. 1, the curve 30 indicates the quality at the interface of the single crystal region. As can be seen, excellent crystal quality was obtained. The minimum channeling yield of the silicon was approximately 3.3 percent, which is identical to that achieved in control samples of essentially defect-free single crystal silicon. (Minimum channeling yield is defined in *Backscattering Spectrometry*, W. Chu, J. W. Mayer, and M. Nicolet, Academic Press, New York (1978).)

EXAMPLE 2

The procedure of Example 1 was followed except the heat treatment time was extended to approximately 60 minutes. Essentially the same results as in Example 1 were obtained.

What is claimed is:

1. A process for fabricating a dielectrically isolated device comprising the steps of (1) implanting oxygen into a substrate comprising silicon to form an oxygen-containing region that is separated from the surface of said substrate by a region of silicon, (2) heat treating said implanted substrate to form a silicon dioxide region, and (3) completing said device in said region of silicon wherein said heat treatment is performed at a temperature of at least 1300 degrees C. for a time period sufficient to ensure that said silicon region is single crystalline and single phase, that said silicon dioxide region is single phase, and that there is essentially a complete absence of any region between said single crystalline silicon region and said silicon phase silicon dioxide region.

2. The process of claim 1 wherein said temperature is at least 1350 degrees C.

3. The process of claim 1 wherein said temperature is at least 1400 degrees C.

4. The process of claim 3 wherein said heat treatment time is in the range 10 minutes to 2 hours.

5. The process of claim 3 wherein said heat treatment is accomplished with electromagnetic radiation.

* * * * *

UNITED STATES PATENT AND TRADEMARK OFFICE
CERTIFICATE OF CORRECTION

PATENT NO. : 4,676,841

DATED : June 30, 1987

INVENTOR(S) : George K. Celler

It is certified that error appears in the above-identified patent and that said Letters Patent is hereby corrected as shown below:

Column 1, line 40, "election" should read --electron--. Column 2, line 9, "dfficiency" should read --efficiency--; line 12, "improvewment" should read --improvement--; line 23, "unreasonable" should read --unreasonably--. Column 4, line 31, "1985I" should read --1985--.

Signed and Sealed this

First Day of March, 1988

Attest:

DONALD J. QUIGG

Attesting Officer

Commissioner of Patents and Trademarks